United States Patent [19]

Kawahito et al.

[11] Patent Number: 4,517,444
[45] Date of Patent: May 14, 1985

[54] THERMAL PRINTHEAD

[75] Inventors: Tsuneyoshi Kawahito, Yokohama; Katsuo Abe, Yokosuka; Tsuneaki Kamei, Kanagawa; Kazuyuki Fujimoto, Tokyo; Masao Mitani; Shigetoshi Hiratsuka, both of Yokohama, all of Japan

[73] Assignee: Hitachi, Ltd., Tokyo, Japan

[21] Appl. No.: 572,519

[22] Filed: Jan. 20, 1984

Related U.S. Application Data

[63] Continuation-in-part of Ser. No. 440,416, Nov. 9, 1982, abandoned.

[30] Foreign Application Priority Data

Nov. 13, 1981 [JP] Japan ................................ 56-181151

[51] Int. Cl.³ .................. G01D 15/10; H05B 3/00; H01C 1/012
[52] U.S. Cl. .................... 219/216; 252/512; 338/309
[58] Field of Search ......... 252/512; 219/543, 216 PH; 338/307, 308, 309

[56] References Cited

U.S. PATENT DOCUMENTS

| 3,203,830 | 8/1965 | Ostrander | 338/308 |
| 3,308,528 | 3/1967 | Bullard | 338/309 |
| 3,381,255 | 4/1968 | Youmans | 252/512 |
| 3,996,551 | 12/1976 | Croson | 338/309 |
| 4,038,517 | 7/1977 | Nelson | 219/216 PH |
| 4,343,986 | 8/1982 | Mitani | 219/216 PH |
| 4,392,992 | 7/1983 | Paulson | 219/543 |

FOREIGN PATENT DOCUMENTS 51-42747  11/1976  Japan .................... 338/308

OTHER PUBLICATIONS

Matino, H., IBM Technical Disclosure Bulletin, "Thermal Print Head Structure", vol. 23, No. 2, Jul. 1980, pp. 841–842.

Primary Examiner—Roy N. Envall, Jr.
Assistant Examiner—Teresa J. Walberg
Attorney, Agent, or Firm—Antonelli, Terry & Wands

[57] ABSTRACT

Disclosed is a thermal printhead made of an insulating substrate, and a heat generating resistor layer formed on the substrate, and wherein the heat generating resistor layer is supplied with electric current. The heat generating resistor layer is made of Cr-Si-SiO alloy, and with the Cr, Si and SiO contents falling within a region defined by points A, B, C and D in a triangular diagram, where the points A, B, C and D are determined as follows:

|   | Cr (mol %) | (Si mol %) | SiO (mol %) |
|---|---|---|---|
| A | 79.4 | 2.1 | 18.5 |
| B | 58.6 | 40.9 | 0.5 |
| C | 10.1 | 89.4 | 0.5 |
| D | 24.4 | 3.7 | 71.9 |

2 Claims, 15 Drawing Figures

THERMAL PRINTHEAD

This is a continuation-in-part application of Ser. No. 440,416, filed Nov. 9, 1982 now abandoned.

BACKGROUND OF THE INVENTION

1. Field of the Invention

The present invention relates to a novel thermal printhead and, more particularly, to a thermal printhead having heat generating resistors made of a Cr-Si-SiO alloy.

2. Description of the Prior Art

Hitherto, the heat generating resistor for use in thermal printhead has been produced either from (1) a Cr-Si alloy as disclosed in the specification of U.S. Pat. No. 4,343,986 or (2) a Cr-SiO alloy as disclosed in IBM Technical Disclosure Bulletin Vol. 23, No. 2, July 1980.

The heat generating resistor made of Cr-Si alloy, however, suffers from the following disadvantages (a) and (b), while the heat generating resistor made of Cr-SiO alloy suffers from the following disadvantages (c) and (d) in addition to the disadvantages (a) and (b) common to the heat generating resistor made of Cr-Si alloy.

(Disadvantages of Heat Generating Resistor Made of Cr-Si Alloy)

(a) The maximum electric power density is as small as several W/mm$^2$.

(b) Resistance value is undesirably changed when the heat generating resistor is used for a long time at a high temperature. For instance, 3 to 7% change in resistance value is caused as compared with the initial resistance value (resistance value after a heat treatment up to high temperature, for instance 400° C., following the film formation by sputtering) after 600 hours operation at 200° C.

(Disadvantage of Heat Generating Resistor Made of Cr-SiO Alloy)

The following disadvantages (c) and (d) are encountered besides the above-mentioned disadvantages (a) and (b).

(c) Only negative temperature coefficient is available so that the use is impractical for heat treatment resistor application.

(d) Etching speed is too low.

Under this circumstance, there is an increasing demand for resistor material having improved performance as the material of, for example, thin film thermal printhead.

SUMMARY OF THE INVENTION

Accordingly, an object of the invention is to provide a thermal printhead capable of overcoming the above-described problems in the resistor material of the prior art. This object can be achieved by the use of a resistor which satisfies the following requirements (a) to (d):

(a) Higher electric dissipation power density;

(b) Small change in resistance value even after long use at high temperature, e.g., 600 hours operation at 250° C.;

(c) Moderate etching speed;

(d) Increased adaptability by widened definable range of temperature coefficient including both of negative and positive ranges.

These requirements are satisfied by a resistor made of a Cr-Si-SiO ternary alloy.

A method of producing a resistor made of Cr-Si-SiO alloy will be outlined hereinunder. Any one of the following three kinds of sputtering target (a) to (c) is used: (a) Cr and Si arranged separately so as to form a sputtering target plate; (b) a Cr-Si alloy; and (c) rectangular pieces of Cr designated at 1 in FIG. 1 and Si designated at 2, arranged alternatingly in a manner as shown in FIG. 1. In FIG. 1, a reference numeral 3 designates a frame which is concealed by a shield plate (not shown). When the target (a) mentioned above is used, the composition of the resistor can be varied by changing the condition of sputtering of Cr and Si. When the target (b) mentioned above is used, the composition of the resistor can be varied through changing the composition of the Cr-Si alloy in the target. Finally, in the case of the target (c), the composition of the resistor is changed through varying the sputtering condition by changing the size of the rectangles to be more exact.

With any one of the targets (a) to (c) mentioned above, the sputtering is conducted by applying a voltage of 0.4 to 10 KV (power density of 0.2 to 10 W/cm$^2$) to the target within an atmosphere containing an inert gas, such as Ar, Kr, Ne or Xe of a partial pressure of 0.5 to 80 mTorr and oxygen gas of a partial pressure of $1 \times 10^{-6}$ to $1 \times 10^{-3}$ Torr.

The resistor represented by Cr-Si-SiO consists of three elements: namely, Cr, Si and O, and has crystalline Cr-Si intermetallic compound and amorphous Cr-Si-SiO in the mixed state. These features clearly distinguish the Cr-Si-SiO resistor of the present invention from conventional amorphous Cr-SiO cermet.

The heat generating resistor for use as the constituent of the thermal printhead has a specific resistance which preferably ranges between $2 \times 10^2$ $\mu\Omega$-cm and $1 \times 10^6$ $\mu\Omega$-cm. Such specific resistance is obtained when the contents of Cr, Si and SiO fall within the area defined by four points A, B, C, and D in the triangular composition diagram in FIG. 2. The points A, B, C and D represent the following compositions, respectively;

|   | Cr (mol %) | Si (mol %) | SiO (mol %) |
|---|---|---|---|
| A | 79.4 | 2.1 | 18.5 |
| B | 58.6 | 40.9 | 0.5 |
| C | 10.1 | 89.4 | 0.5 |
| D | 24.4 | 3.7 | 71.9 |

BRIEF DESCRIPTION OF THE DRAWINGS

FIG. 9b is a sectional view along the line IXb—IXb in FIG. 9a.

DESCRIPTION OF THE PREFERRED EMBODIMENTS

The invention will be described in more detail hereinunder with reference to the accompanying drawings.

EXAMPLE 1

An explanation will be made hereinunder as to the method of producing a heat-generating resistor layer.

(Method of Producing Heat Generating Resistor Layer)

The target was placed within a vacuum vessel so as to oppose to a substrate having glazed layer of 60 μm thick. The target had a predetermined ratio of area between Si and Cr, e.g. 80:20.

The vacuum vessel of the DC sputtering device was evacuated by a suitable evacuating means down to a vacuum of a level less than $5 \times 10^{-7}$ Torr. Argon gas having a predetermined oxygen content was introduced into the evacuated vessel to provide an atmosphere having a partial pressure of argon gas of 1 to 10 m Torr and a partial pressure of oxygen gas of $1 \times 10^{-7}$ Torr to $1 \times 10^{-3}$ Torr. While rotating the substrate as desired, a voltage of 400 to 10 KV was applied to the target to cause a glow discharge thereby to form on the substrate surface a thin film of a Cr-Si-SiO alloy having a predetermined composition by sputtering. The thickness of the thus formed film was 1000 to 3000 Å.

An explanation will be made hereinunder as to an identification of the heat generating resistor layer thus formed, as well as the result of the identification.

(Identification of Heat Generating Resistor Layer)

The Cr-Si-SiO alloy produced by the method explained above was subjected to an identification. First of all, an element analysis of the resistor was conducted by a plasma spectral analysis. The elements were made to illuminate at a temperature of 6000° to 8000° C. The elements were identified qualitatively from the spectral distribution and identified quantitatively from the levels of the spectrum. As a result, the resistor proved to consist of 72.0 at% Si and 28.0 at% Cr.

The state and amount of atomic bonding were examined by an X-ray electron analysis. An X-ray was irradiated to the resistor to excite and free photoelectrons. The state of atomic bonding was determined from the amount of the chemical shift, i.e. the amount of spectrum of photoelectron energy, from the spectrum obtained from a standard specimen, while the composition ratio was determined from the spectral level ratio. The following facts (1) and (2) proved as a result of the X-ray electron analysis.

(1) The presence of Cr-O bonding can be known from the amount of chemical shift from the Cr-Cr bonding. In this case, however, no such chemical shift was observed. This means that there is no oxide of Cr in this alloy.

(2) The presence of Si-O bonding can be known from the amount of chemical shift from the Si-Si bonding. From the spectral level ratio, it proved that the existing ratio between Si element and Si oxide is 95:5. From these facts, the composition ratio Cr:Si:SiO proved to be 28.0:68.5:3.5.

Figure 3A:
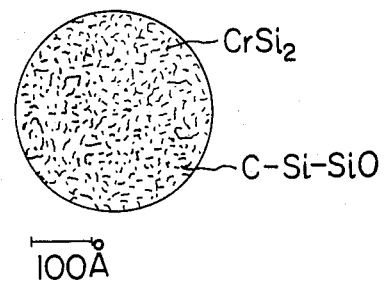
FIGS. 3a, 3b and 3c are sketches of transmission electron microscope images of the resistor constituting the thermal printhead of the invention.

As shown in FIG. 3a, from transmission electron microscope image, the presence of crystalline CrSi$_2$ region and the presence of amorphous Cr-Si-SiO region were confirmed. The degree of crystallization proved to be small.

EXAMPLE 2

Figure 3B:
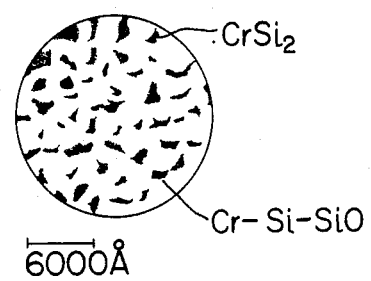
Figure 3C:
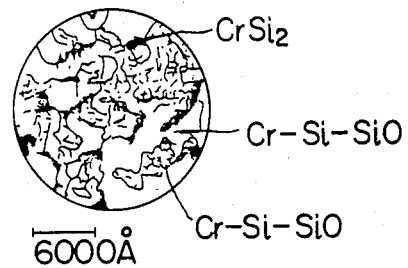

A resistor (see No. 2 in the following Table) was formed on a substate by a DC sputtering device. Another resistor (see No. 3) was formed on a substrate by a planar magnetron type DC sputtering device. These resistors were identified in the same manner as Example 1 to obtain identification result as shown at No. 2 and No. 3 in the Table. Also, transmission electron microscope image shown in FIGS. 3b and 3c were obtained, and from which images it will be seen that the degree of crystallization in FIG. 3b is more advanced than that in FIG. 3a and that in FIG. 3c is further more advanced than that in FIG. 3a. Then, properties such as (1) specific resistance, (2) temperature coefficient of resistance, (3) hardness, (4) tensile stress, (5) density and (6) etchability were measured for the resistors produced in accordance with the methods of Examples 1 and 2, the results of which are shown at Nos. 1, 2 and 3 in the column of properties in the following Table, respectively.

TABLE

| items | No. 1 | No. 2 | No. 3 |
|---|---|---|---|
| result of identification | | | |
| Si:Cr | 72.0:28.0 | 63.8:36.2 | 66.0:34.0 |
| Cr:(oxidized Cr) | 100:0 | 100:0 | 100:0 |
| Si:(oxidized Si) | 95:5 | 71:24 | 91:9 |
| Cr:Si:SiO | 28.0:68.5:3.5 | 36.2:45.3:18.5 | 34.0:60.1:5.9 |
| properties | | | |
| specific resistance (μΩcm) | 1010 | 2130 | 2830 |
| temperature coefficient of resistance (PPm) | −310 | 90 | 500 |
| hardness (Hv:Kg/mm$^2$) | 1030 | 670 | 1230 |
| tensile stress (Kg/mm$^2$) | −20 | −36 | 123 |
| density (g/cm$^3$) | 3.6 | 3.4 | 40.5 |
| etching controllability | | good | |
| remarks | | | |
| sputtering device | DC sputtering device | DC sputtering device | Planar magnetron type DC sputtering device |
| target area ratio | | Si:Cr = 80:20 | |

EXAMPLE 4

Figure 4:
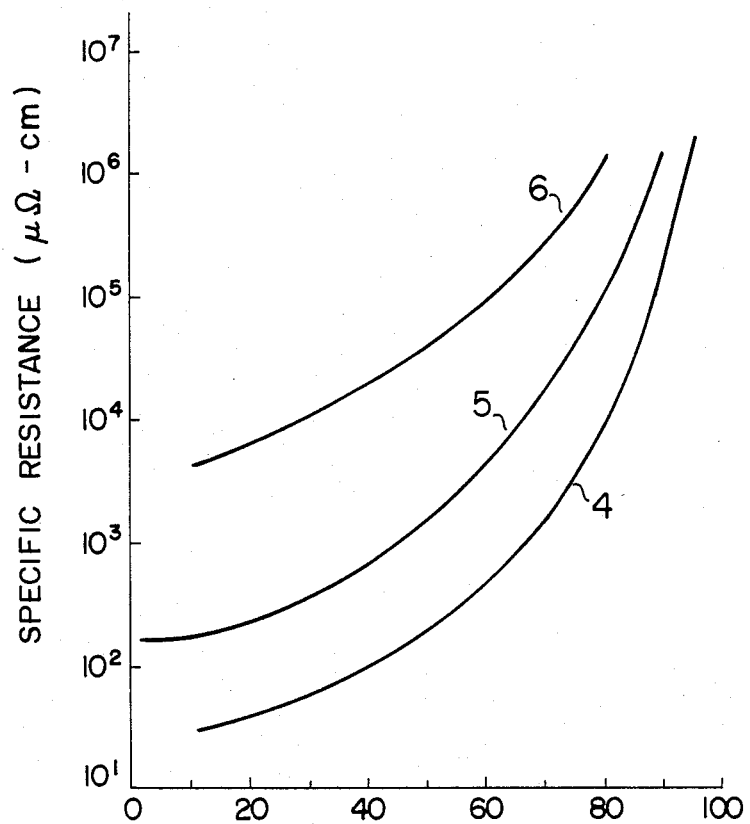
FIGS. 4 to 8 and 10 to 12 show various properties of the resistor for use in a thermal printhead of the invention.
Figure 5:
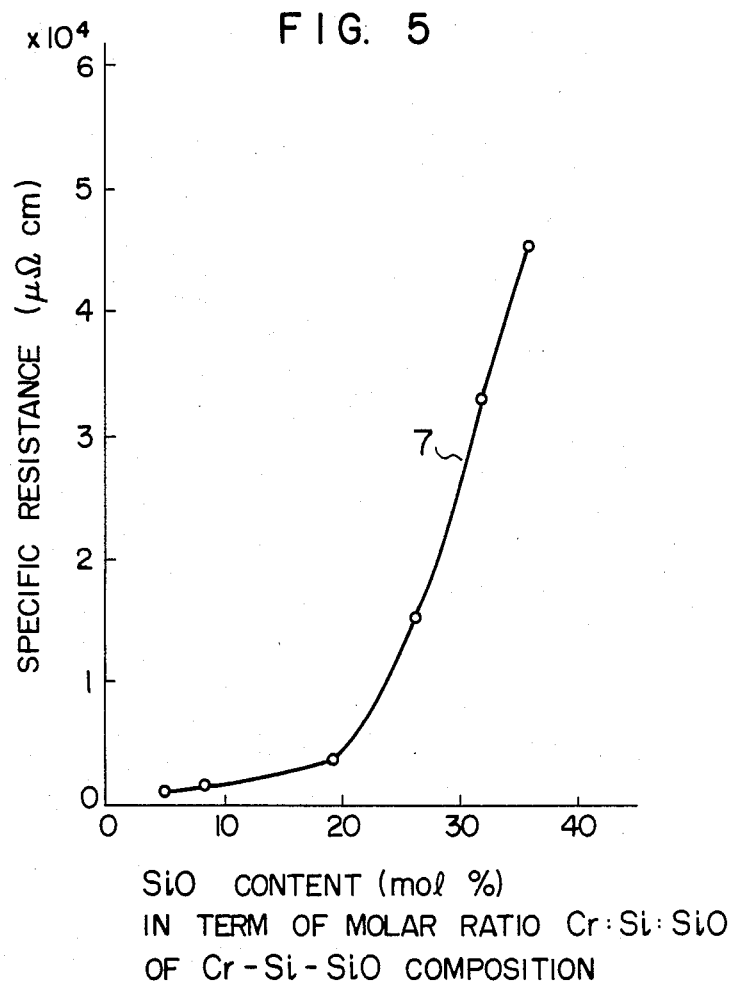

Three kinds of Cr-Si-SiO ternary alloys were formed. These alloys were: a first alloy containing 4.0 to 4.5 mol% of SiO and the balance of Cr and Si, a second alloy containing 18 to 19 mol% of SiO and the balance of Cr and Si and a third alloy containing 30 to 31 mol% of SiO and the balance of Cr and Si. Curves 4, 5 and 6 in FIG. 4 represent above-mentioned three alloys; the first, second and the third alloys, respectively. These curves show how the specific resistance values in these alloys are changed by a change in the existing ratio of Si to Cr. A curve 7 in FIG. 5 shows the change in the specific resistance caused by a change in the existing ratio of (Cr+Si) to SiO when the existing ratio of Si:(Si+Cr) is 28 to 58 mol%.

EXAMPLE 5

Temperature coefficients of resistance of the following Cr-Si-SiO ternary alloys were measured. An alloy containing 33.3 mol% of Cr, 66.2 mol% of Si and 0.5 mol% of SiO exhibited a temperature coefficient of +2500 PPm at a temperature between 18° C. and 300° C. Another alloy containing 10.4 mol% of Cr, 65.0 mol% of Si and 24.6 mol% of SiO showed a temperature coefficient of −10000 PPm within the same temperature range as above. Alloys containing 19 to 44 mol% of Cr, 40 to 55 mol% of Si and 12 to 27 mol% of SiO showed a temperature coefficient ranging between −100 PPM and +100 PPm within the same temperature range.

EXAMPLE 6

Figure 6:
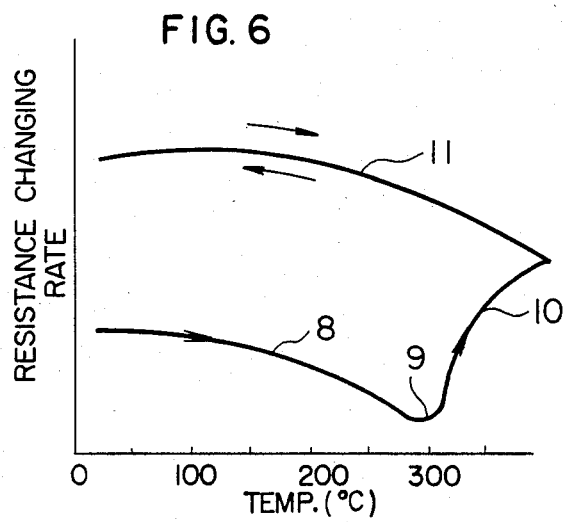

FIG. 6 shows how the resistance value is changed by a heat treatment of Cr-Si-SiO ternary alloy when the rate of temperature rise is 2° C./min. It will be see that there is a region 8 in which the resistance value is decreased in accordance with the temperature rise. The region 8 is connected irreversibly through a point 9 of minimum resistance to a region 10 in which the resistance value is increased in accordance with the temperaure rise. The region 10 is then connected to a region 11 in which the resistance value is reversibly changed as the temperature is raised and lowered. The minimum value at the point 9 is determined by various factors such as composition ratio of the Cr-Si-SiO, film forming method and the film forming temperaure.

The gradient of the curve in the region 11 corresponds to the temperature coefficient itself, which depends on the factors such as composition ratio of Cr-Si-SiO, degree of crystallization and so forth. The rate of change in the resistance by heat treatment depends on the temperature at which the film is formed. The specific resistance $\rho$ is determined by the composition of Cr-Si-SiO and the temperature of heat treatment, but does not depend to the temperature at which the film is formed.

From these facts, it is understood that a heat treatment at a temperature above the temperature corresponding to the point 9 is essential in order to stabilize the resistance value. In some cases, however, the resistance value can be stabilized if this temperature has been reached during the formation of the film.

Figure 7:
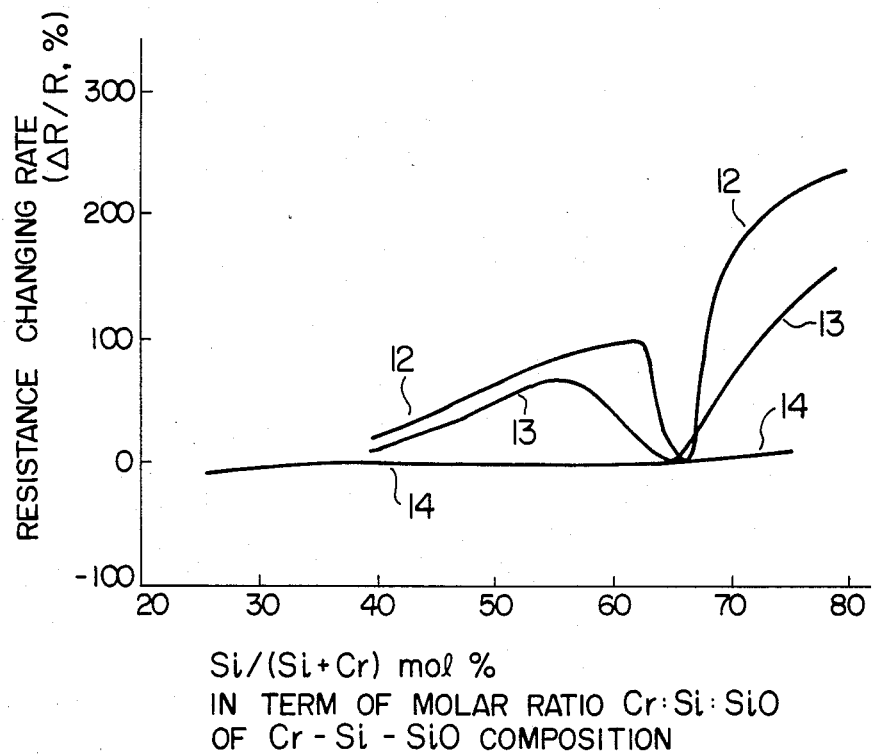

Three kinds of Cr-Si-SiO ternary alloys having SiO contents of not greater than 0.5 mol%, 3.8 to 4.3 mol% and 18 to 19 mol% were prepared with the ratio of Si to Cr being varied. These alloys were subjected to a heat treatment conducted at 400° C. Curves 12, 13 and 14 in FIG. 7 show the rates of change in resistance value caused by the heat treatment in respective alloys. From this Figure, it will be realized that almost no change in resistance value is caused even when the ratio of Si to Cr is varied, when the SiO content ranges between 18 and 19 mol%.

Considering the fact that the degree of oxidation of the Cr-Si-SiO alloy is not changed by the heat treatment, it is understood that the change in the resistance value caused by the heat treatment is attributable to the change in the state of oxygen in the amorphous state, i.e., the oxygen not contributing to the crystallization.

EXAMPLE 7

Figure 8:
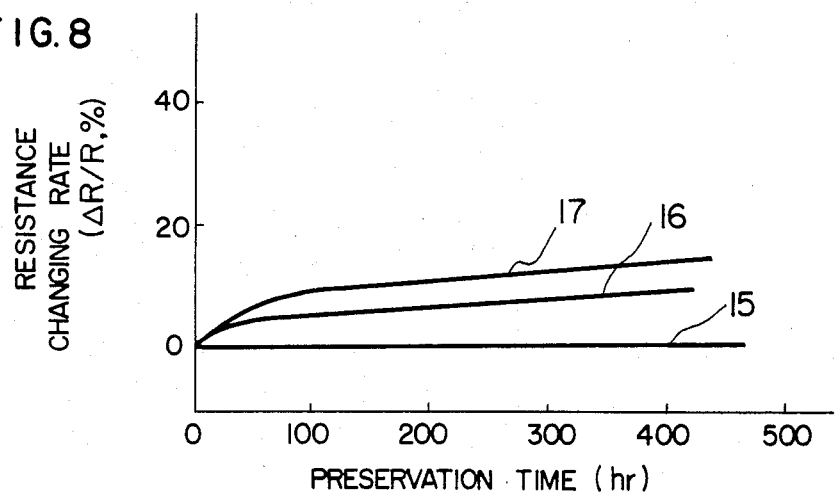

Three kinds of alloys were prepared. These alloys were: a Cr-Si-SiO ternary alloy having a composition ratio Cr:Si:SiO of 36.1:45.4:18.5 (mol %); a Cr-Si alloy; and a Cr-Sio alloy. A test was made to investigate the change in resistance value exhibited by these alloys after leaving them for a long time in air of 450° C., and the result of which test is shown by curves 15, 16 and 17 in FIG. 8. It will be seen from this Figure that the novel resistor made of Cr-Si-SiO alloy in accordance with the invention exhibits a superior oxidation resistance, as well as a high stability in resistance value.

This test result also suggests that the resistor made of Cr-Si-SiO alloy in accordance with the invention stands a higher electric power density than other resistors made of other alloy such as Cr-Si or Cr-SiO alloy. For instance, with the resistor made of the ternary alloy in accordance with the invention, it is possible to increase the electric power density to the level of 20 to 40 W/mm$^2$ at 300° C.

EXAMPLE 8

A test was conducted to examine the speed of etching necessary for fine fabrication processing of the thin film resistor. Both of a resistor made of Cr-Si-SiO alloy and a resistor made of Cr-SiO alloy were etched by an etchant consisting of a mixture of HF and HNO$_3$ which are mixed at a volume ratio HF/HNO$_3$ of 1/30. The resistor made of Cr-Si-SiO alloy exhibited an etching speed of 500 to 6000 Å/min, while the resistor made of Cr-SiO alloy exhibited an etching speed of 8 Å/min. A resistor made of Cr-Si alloy was etched by the same etchant but the etching speed was too high to achieve a delicate fine processing.

EXAMPLE 9

Figure 1:
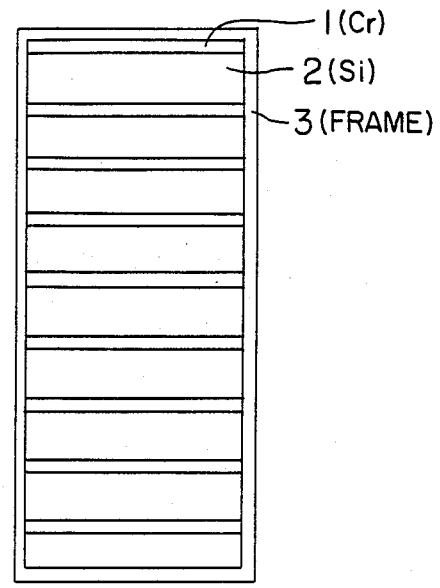
FIG. 1 is an illustration of an example of sputtering targets.
Figure 2:
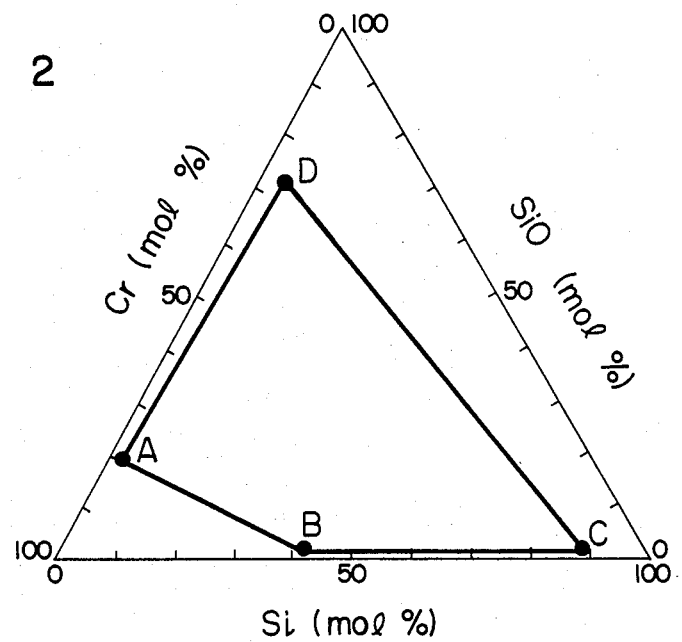
FIG. 2 is a composition diagram showing the composition range of a resistor usable as the heat generating resistor constituting a thermal printhead of the invention.

A heat generating resistor made of Cr-Si-SiO alloy is formed on an alumina substrate 18 having a glazed layer 19 of 60 μm thick by a DC sputtering method. A striped target, as shown in FIG. 1, having an area ratio Cr:Si of 20:80 was used. Using Ar gas as the sputtering gas, the sputtering was conducted under the following condition: Ar gas partial pressure of 30 m Torr; oxygen gas partial pressure of $2.0 \times 10^{-6}$ Torr.; sputtering electric power of 1.0 KW, sputtering time of 10 minutes and substrate temperature during sputtering of 400° C.

The Cr-Si-SiO film thus formed had a specific resistance of 2700 μΩ-cm and a film thickness of 1500 Å. This film was subjected to a plasma spectral analysis and an X-ray photoelectron spectral analysis. As a result, it proved that the heat generating resistor layer 20 had a composition ratio Cr:Si:SiO of 36.2:45.3:18.5 (molar ratio) in which there was no oxidation of Cr but Si had been oxidized partially.

Then, a Cr film of 1000 Å thick was formed by sputtering as a bonding layer 21 between the Cr-Si-SiO film and the wiring conductor 22, followed by the formation of Al layer of 1 μm thick also by sputtering as the wiring conductor 22.

Subsequently, the heat generating resistor layer 20 was patterned to have a width of 90 μm and a length of 250 μm at a pitch of 125 μm. A mixture of HF and HNO$_3$ mixed at a ratio HF/NHO$_3$ of 1/30 was used as the etchant. The etching time was 30 seconds.

Figure 10:
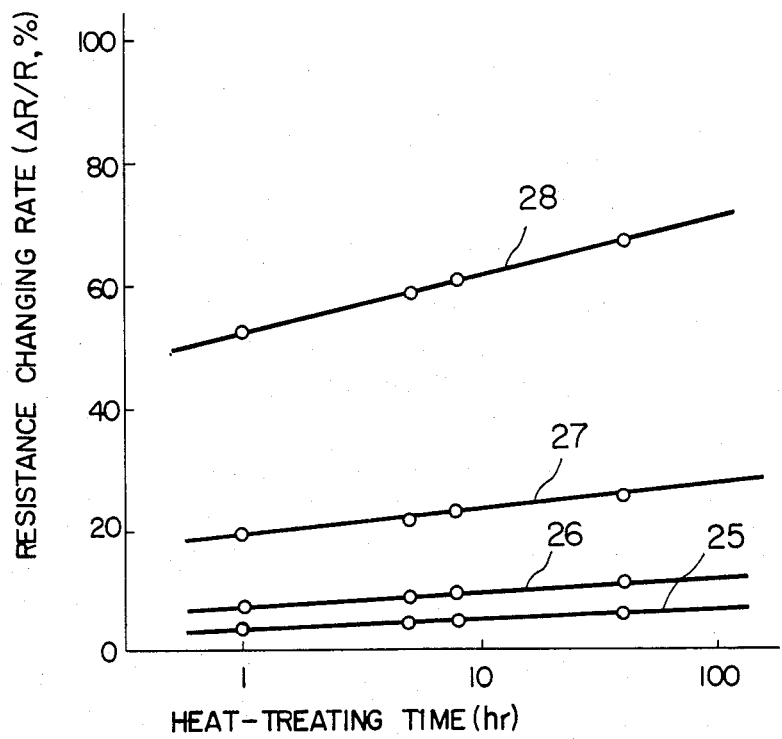

The thus formed resistor was then subjected to a heat treatment which was conducted at different temperature of 400° C. and 500° C. in the air, to obtain resistance values as shown by curves 25 and 26 in FIG. 10. Similar heat treatment was conducted also in a nitrogen atmosphere and in vacuum atmosphere and results similar to those shown in FIG. 10 were obtained. It proved also that the heat treatment may be effected after the formation of the wiring conductor layer or after formation of anti-oxidation protection layer or wear-resistant protecting layer on the wiring conductor layer. It is also possible to heat the substrate to a predetermined temperature in forming the Cr-Si-SiO heat generating resistor by sputtering or the like method.

Then, an SiO$_2$ film of 3 μm thick and a Ta$_2$O$_5$ film of 5 μm thick were successively formed by a high-frequency sputtering method as an anti-oxidation protection layer 23 and a wear-resistant layer 24 covering the heat-generating resistor layer 20 and the wiring conductor layer 22.

The resistor thus formed was then subjected to a step-up stress test in which 60,000 pulses of a pulse width of 1 mSec and a pulse period of 10 mSec were applied, and the change in resistance value after heating at high temperature for a long time was examined. As a result, it proved that no substantial change in the resistance value is caused up to the power density of 45 W/mm$^2$ and the rate of change in resistance value was as small as 8.5% even at the power density of 55 W/mm$^2$.

The resistor was heated by an application of pulses of a pulse width of 1 mSec and a pulse period of 10 mSec at a power of 32.9 W/mm$^2$.

As a result, it proved that the heat generating peak temperature ranges between 320° C. and 330° C. The resistance value was changed only by 5% as compared with the initial value and no change in appearance of the resistor was observed even after application of two hundred million pulses.

EXAMPLE 10

Figure 9A:
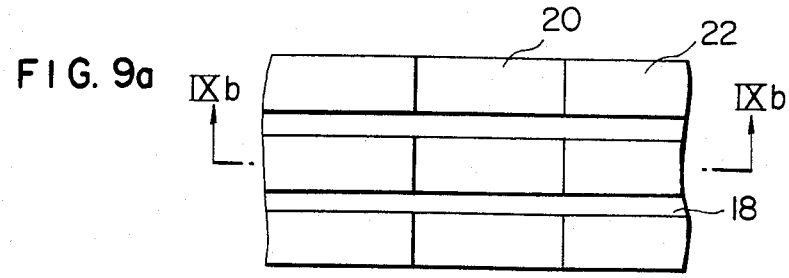
FIG. 9a is a plan view of a thermal printhead of the invention.
Figure 9B:
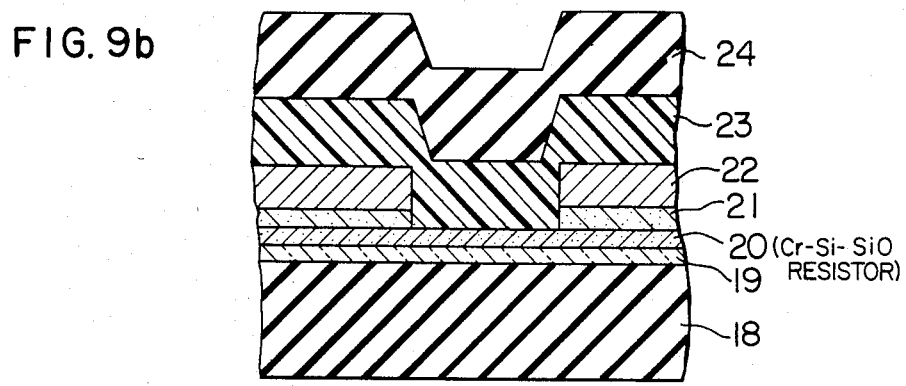

A Cr-Si-SiO resistor film was formed by a DC sputtering method on an alumina substrate 18 having a glazed layer 19 of 60 μm thick as shown in FIG. 9b.

The sputtering was conducted using a striped target as shown in FIG. 1 having the area ratio Cr:Si of 30:70 and Ar gas as the sputtering gas, under the condition of Ar gas partial pressure of 3 mTorr, oxygen gas partial pressure of $1.0 \times 10^{-7}$ Torr, target voltage of 800 V, sputtering time of 20 minutes and substrate temperature during sputtering of 150° C.

The Cr-Si-SiO resistor film thus formed exhibited a specific resistance of 500 μΩ-cm and a film thickness of 1200 Å. This resistor film was then subjected to a plasma spectral analysis and an X-ray photoelectron spectral analysis. As a result, it proved that the composition ratio Cr:Si:SiO of this resistor film was 35.9:60.5:3.6 (molar ratio), and that there is no oxidation of Cr but Si has been oxidized partially.

Thereafter, the Cr layer as the bonding layer between the resistor and the wiring conductor, Al wiring conductor layer, anti-oxidation protection layer of SiO$_2$ and a wear-resistant layer of Ta$_2$O$_5$ were formed in the same way as Example 9. The thus formed resistor had a breadth of 90 μm and a length of 250 μm, and exhibited a resistance value of 117Ω. The resistor was then subjected to heat treatment conducted at different temperatures of 400° C. and 500° C. within a nitrogen atmosphere. Curves 27 and 28 in FIG. 10 show how the resistance value is changed as a result of this heat treatment.

The resistor thus formed was then subjected to a step-up stress test in which 60,000 pulses of a pulse width of 1 mSec and a pulse period of 10 mSec were applied. As a result, it proved that no substantial change in resistance value is caused up to power density of 30 W/mm$^2$ and the rate of change in resistance value was 9.3% at the power density of 37.5 W/mm$^2$.

Then, the resistor was heated by application of pulses of a pulse width of 1 mSec, pulse period of 10 mSec and electric power density of 32.9 W/mm$^2$. As a result, it proved that the heat generating peak temperature was 310° to 320° C. The rate of change in the resistance value was +9.7% after application of 30 million pulses and +7.0% after application of 70 million pulses. The resistor was broken down by application of 80 million pulses.

EXAMPLE 11

Two thermal printheads of the construction as shown in FIG. 9 were produced in accordance with the methods explained in Examples 9 and 10. A test (step-up stress test) was conducted to examine the stability of heat generating resistors in a long use at high temperature.

Figure 11:
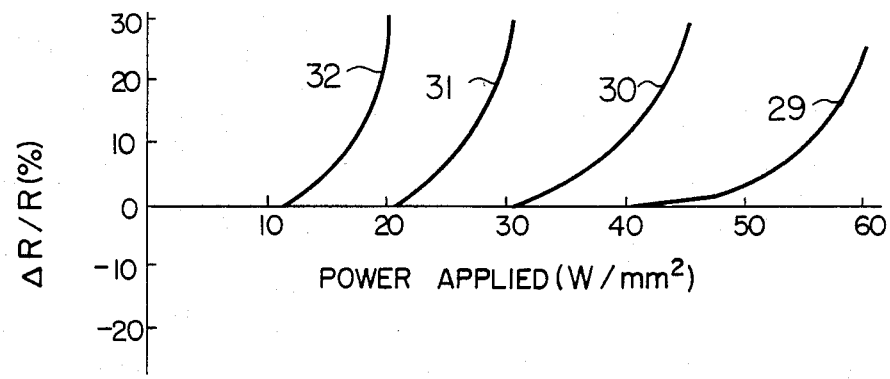

FIG. 11 shows the rate of change in the resistance value caused by application of 60,000 pulses of a pulse width of 1 mSec and pulse interval of 10 mSec while increasing the electric power of applied pulse at a pitch of 2.5 W/mm$^2$. In FIG. 11, a curve 29 shows the resistance change with the resistor having a composition ratio Cr:Si:SiO of 36.2:45.3:18.5 (molar ratio) while a curve 30 shows that with the resistor having the composition ratio Cr:Si:SiO of 28.0:68.5:3.5 (molar ratio). Also, a curve 31 shows the data as obtained with a resistor made of an alloy having an SiO content of 0.5% by molar ratio and having a composition ratio of Cr:Si of 28.9:70.6 (molar ratio). In FIG. 11, a curve 32 shows the data as obtained with a reference resistor of Ta$_2$N having a specific resistance of 250 μΩ-cm.

From these curves, it is understood that the heat generating resistors having properties as shown by curves 29 and 30 exhibit no substantial change in the resistance value when the electric power density is less than 30 W/mm$^2$ and, therefore, are superior to the resistors having the properties shown by curves 31 and 32.

Figure 12:
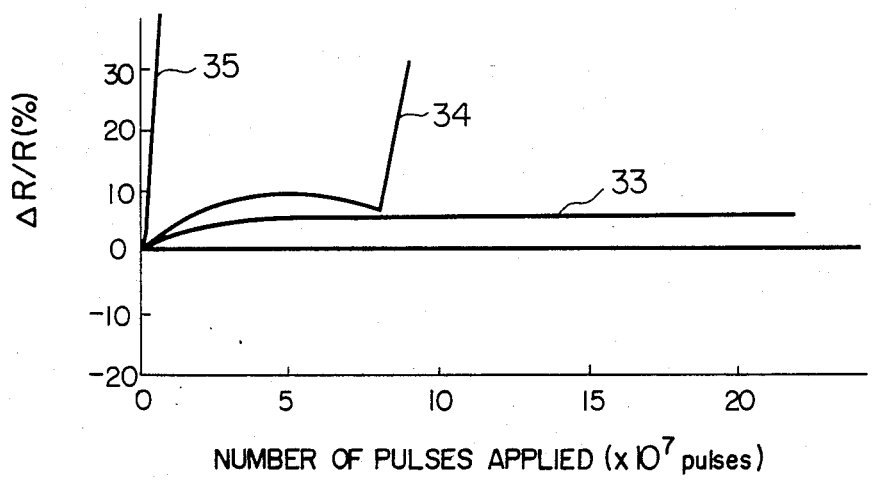

FIG. 12 shows the change in the resistance value as observed when pulses of a pulse width of 1 mSec and pulse interval of 10 mSec were continuously applied to the resistor at electric power of 32.9 W/mm$^2$. In this Figure, curve 33 denotes data as obtained with a resistor having a composition ratio Cr:Si:SiO of 35.6:45.9:18.5 (molar ratio), while a curve 34 shows the data as obtained with a resistor having a composition ratio Cr:Si:SiO of 28.0:68.2:3.8 (molar ratio). Data obtained with a reference Ta$_2$N resistor are shown by a curve 35.

As will be seen from the curves 33 and 34, the resistors in accordance with the invention exhibit only a small rate of change in resistance value of not greater than 10%, even after application of 80 million pulses, while the reference resistor of TaN$_2$ was broken after application of only 5 million pulses. From this fact, it will be understood that the heat generating resistor of the invention can withstand a use over a sufficiently long time.

What is claimed is:

1. A thermal printhead comprising an insulating substrate, a heat generating resistor layer formed on said substrate and means for supplying said heat generating resistor layer with electric current, wherein said heat generating resistor layer is made of Cr-Si-SiO alloy, the Cr, Si and SiO contents falling within a region defined by points A, B, C and D in a triangular diagram, where said points A, B, C and D are determined as follows:

|   | Cr (mol %) | Si (mol %) | (SiO mol %) |
|---|---|---|---|
| A | 79.4 | 2.1 | 18.5 |
| B | 58.6 | 40.9 | 0.5 |
| C | 10.1 | 89.4 | 0.5 |
| D | 24.4 | 3.7 | 71.9 |

2. A thermal printhead according to claim 1, wherein said heat generating resistor layer has a heat generating peak temperature, and wherein said Cr-Si-SiO alloy constituting said heat generating resistor layer has been subjected to a heat treatment conducted at a temperature higher than the heat generating peak temperature of said heat generating resistor layer.

* * * * *